(12) United States Patent
Lee et al.

(10) Patent No.: US 8,464,589 B2
(45) Date of Patent: Jun. 18, 2013

(54) MICRO-ELECTROMECHANICAL SYSTEMS (MEMS) STRUCTURE

(75) Inventors: Chien-Hsing Lee, Hsinchu County (TW); Tsung-Min Hsieh, Taipei County (TW); Li-Chi Tsao, Taichung (TW); Jhyy-Cheng Liou, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 376 days.

(21) Appl. No.: 12/904,169

(22) Filed: Oct. 14, 2010

(65) Prior Publication Data
US 2012/0090398 A1    Apr. 19, 2012

(51) Int. Cl.
*G01L 7/08*    (2006.01)

(52) U.S. Cl.
USPC ............................. 73/715; 73/700; 361/283.1

(58) Field of Classification Search
None
See application file for complete search history.

(56) References Cited

U.S. PATENT DOCUMENTS

| | | | | |
|---|---|---|---|---|
| 5,184,514 A | * | 2/1993 | Cucci et al. | 73/706 |
| 5,230,248 A | * | 7/1993 | Cucci et al. | 73/706 |
| 5,447,067 A | * | 9/1995 | Biebl et al. | 73/514.32 |
| 5,545,594 A | * | 8/1996 | Cahill | 438/51 |
| 5,870,482 A | * | 2/1999 | Loeppert et al. | 381/174 |
| 5,888,412 A | * | 3/1999 | Sooriakumar et al. | 216/41 |
| 6,535,460 B2 | * | 3/2003 | Loeppert et al. | 367/181 |
| 6,705,166 B2 | * | 3/2004 | Leonardson | 73/514.32 |
| 7,242,570 B2 | * | 7/2007 | Takahashi | 361/290 |
| 7,322,240 B2 | * | 1/2008 | Robert | 73/514.32 |
| 7,536,769 B2 | * | 5/2009 | Pedersen | 29/594 |
| 7,617,729 B2 | * | 11/2009 | Axelrod et al. | 73/514.32 |
| 7,701,110 B2 | * | 4/2010 | Fukuda et al. | 310/309 |
| 7,951,636 B2 | * | 5/2011 | Lee et al. | 438/53 |
| 2007/0080765 A1 | * | 4/2007 | Lee et al. | 335/78 |

OTHER PUBLICATIONS

Patrick R. Scheeper, Wouter Olthuis, and Piet Bergveld, "The Design, Fabrication, and Testing of Corrugated Silicon Nitride Diaphragms," Journal of Microelectromechanical Systems, vol. 3, No. 1, Mar. 1994, pp. 36-42.

Quanbo Zou, Zhijian Li, and Litian Liu, "Design and Fabrication of Silicon Condenser Microphone Using Corrugated Diaphragm Technique," Journal of Microelectromechanical Systems, vol. 5, No. 3, Sep. 1996, pp. 197-204.

* cited by examiner

*Primary Examiner* — Lisa Caputo
*Assistant Examiner* — Jermaine Jenkins
(74) *Attorney, Agent, or Firm* — Jianq Chyun IP Office

(57) ABSTRACT

A MEMS structure includes a substrate, a structural dielectric layer, and a diaphragm. A structural dielectric layer is disposed over the substrate. The diaphragm is held by the structural dielectric layer at a peripheral end. The diaphragm includes multiple trench/ridge rings at a peripheral region surrounding a central region of the diaphragm. A corrugated structure is located at the central region of the diaphragm, surrounded by the trench/indent rings.

20 Claims, 9 Drawing Sheets

MICRO-ELECTROMECHANICAL SYSTEMS (MEMS) STRUCTURE

BACKGROUND OF THE INVENTION

1. Field of Invention

The present invention relates to micro-electromechanical systems (MEMS) structure. More particularly, the present invention relates to MEMS structure with a sensing diaphragm.

2. Description of Related Art

The sensitivity of a MEMS structure, such as MEMS microphone, is strongly dependent on the residual stress of the diaphragm in the MEMS structure. The residual stress of a diaphragm varies with the fabrication process including the different thermal expansion between different materials, non-uniform micro-structure in single material during growth and others like package, operation environment, etc.

To design a diaphragm which can reduce the effect of the residue stress becomes an important task. Conventionally, several trench rings are formed at the peripheral region of the diaphragm to absorb the residue stress.

SUMMARY OF THE INVENTION

The invention provides a MEMS structure with a diaphragm capable of efficiently absorbing residue stress and then improving the sensitivity to air pressure.

The invention provides a MEMS structure includes a substrate, a structural dielectric layer, and a diaphragm. The structural dielectric layer is disposed over the substrate. The diaphragm is held by the structural dielectric layer at a peripheral end. The diaphragm includes multiple trench/ridge rings at a peripheral region surrounding a central region of the diaphragm. A corrugated structure is located at the central region of the diaphragm, surrounded by the indent rings.

The invention provides MEMS structure includes a substrate, a structural dielectric layer, and a diaphragm. The structural dielectric layer is disposed over the substrate. The diaphragm is held by the structural dielectric layer at a peripheral end. The diaphragm includes multiple trench/ridge rings at a peripheral region surrounding a central region of the diaphragm. Each of the trench/ridge rings is discontinuous and formed by a plurality of trench/ridge segments.

According to an embodiment as an example, the trench/ridge rings are discontinuous. Each of the trench/ridge rings being discontinuous is formed by a plurality of trench/ridge segments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

In the invention, a novel MEMS structure is proposed. The MEMS structure can be a MEMS microphone in application, for example. In order to improve the sensitivity of the diaphragm in the MEMS structure to absorb the residue pressure, the diaphragm has been designed with outer indent rings and the inner corrugate structure. The pattern is constructed by a plurality of trenches or indentations in the diaphragm. The continuous or discontinuous ring-type trenches in the edge of the diaphragm is used to absorbed the net horizontal stress of a diaphragm; while a plurality of indentation or small trenches distributed uniformly on the diaphragm is used to absorbed the localized stress of a diaphragm.

Several embodiments are provided for describing the invention. However, the invention is not just limited to the embodiments. Also, the embodiments can also be properly combined.

Figure 1:
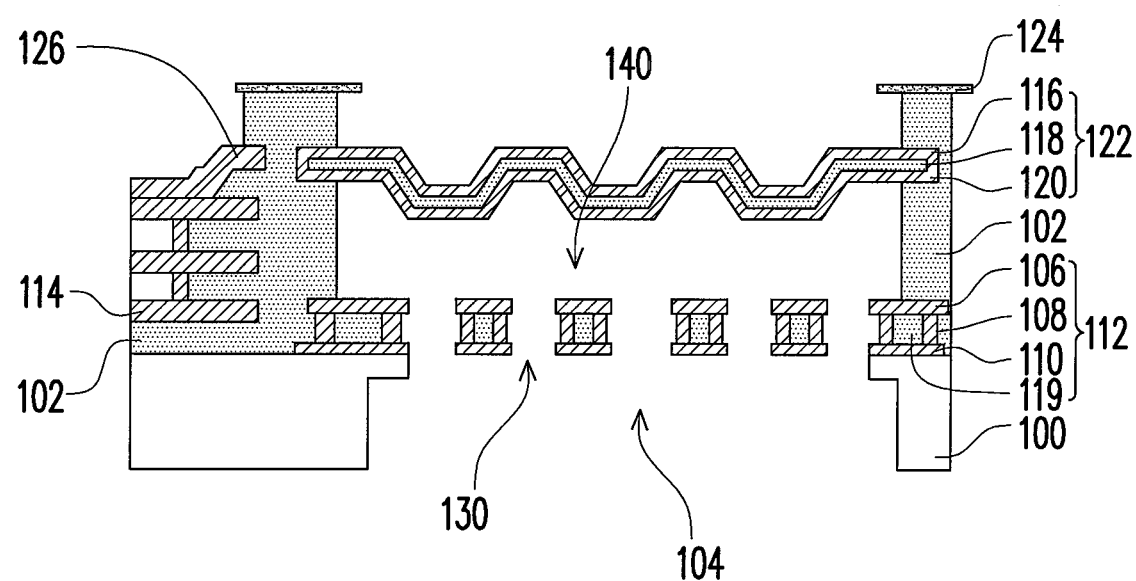
FIG. 1 is a cross-sectional drawing, schematically illustrating a MEMS structure, according to an embodiment of the invention.

FIG. 1 is a cross-sectional drawing, schematically illustrating a MEMS structure, according to an embodiment of the invention. In FIG. 1, a substrate 100, such as silicon substrate, has a front side and a back side. A structural dielectric layer 102 is disposed on the substrate 100 at the front side. The substrate has a cavity 104 at the back side of the substrate 100 to expose the structural dielectric layer 102. The structural dielectric layer 102 includes several structure embedded inside. For example, a diaphragm 122 is held by the structural dielectric layer 102 at a peripheral end. The diaphragm 122 is above the substrate 100 corresponding to the cavity 104 and forms a chamber 140 between the substrate 100 and the diaphragm 122. The chamber is connected to the cavity 104 by through holes 130. In this example, a structure layer 112 with multiple through holes 130 is also formed in the structural layer 102 on the substrate 100, so that the chamber is connected with the cavity 104. The diaphragm 122 can be corrugate structure and be a stack structure from a lower conductive layer 120, an upper conductive layer 116 and a dielectric layer between the lower conductive layer 120 and the upper conductive layer 116. In addition, the structure layer 112 can also be a stack structure from an upper conductive layer 106, a lower conductive layer 110, and a conductive wall 108 and a dielectric 119 between the conductive wall 108 and both the upper and lower conductive layers 106, 110. The through holes 130 are defined by the conductive wall 108. Also and an interconnection structure with a bonding pad 126 may also be formed in the structural dielectric layer 102. In order to expose the diaphragm 122 by anisotropic etching process, such as wet etching, during fabrication processes, an etching mask layer 124 is also formed on the structural dielectric layer 102. Here, the structure in FIG. 1 can be fabricated by semiconductor fabrication process including photolithographic and etching process, polishing, and deposition etc. The structural dielectric layer 102 is a general structure composed of multiple dielectric layers in several steps.

The diaphragm 122 is designed to have indent structure. Equivalently, when the diaphragm 122 is up-side-down, the indents become the ridge. Therefore, the term of indent/ridge is used for this consideration. However, in the provided embodiments, just the indent structure is shown. More details for the diaphragm 122 are to be described later.

Figure 2A:
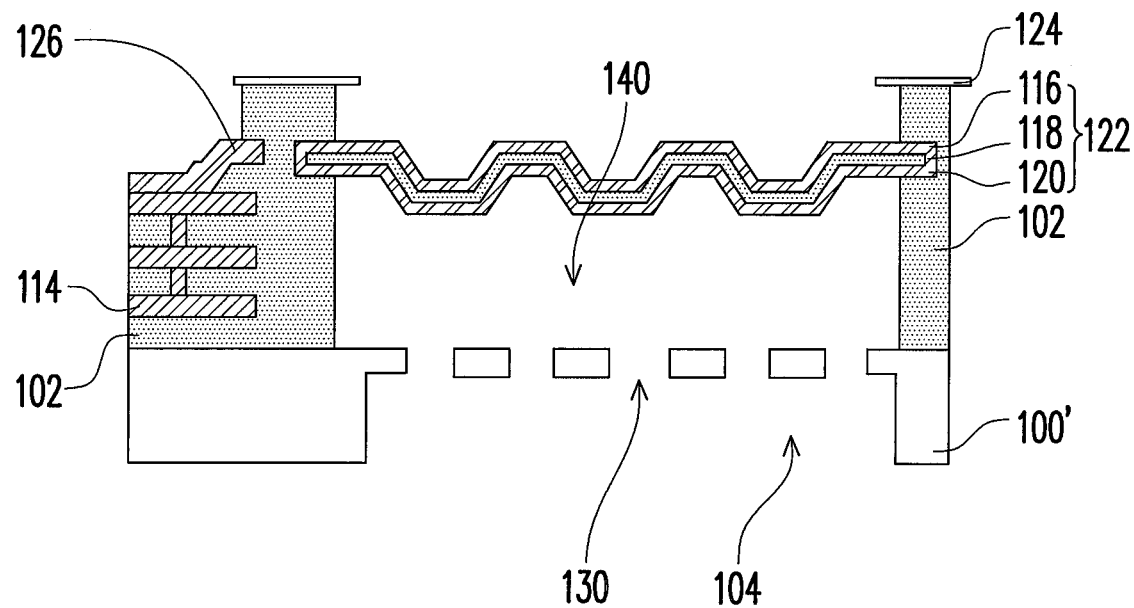
FIGS. 2A-2B are cross-sectional drawings, schematically illustrating MEMS structures, according to embodiments of the invention.
Figure 2B:
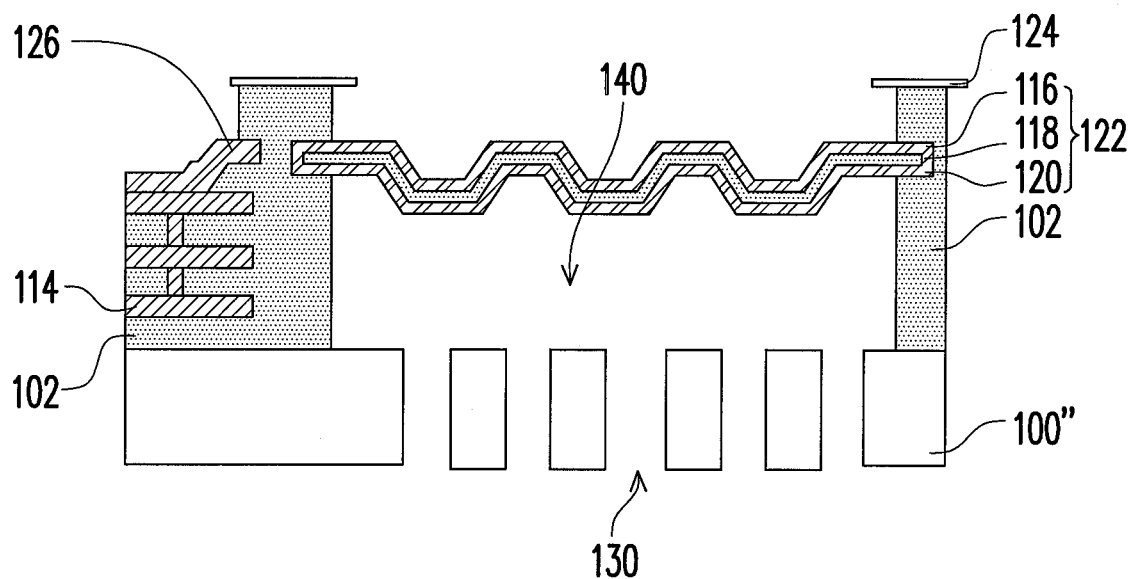

In view of the structure of FIG. 1, alternatively, the through holes 130 can be directly formed in the substrate 100 in accordance with the cavity 104. FIGS. 2A-2B are cross-sectional drawings, schematically illustrating MEMS structures, according to embodiments of the invention. In FIG. 2A with comparison in FIG. 1, the through holes 130 are directly formed in the substrate 100' within the cavity 104. In this embodiment, the structure layer 112 in FIG. 1 is omitted. However, the through holes 130 can be just formed in the substrate 100'. In other words, the through holes 130 are used to connect the spaces in chamber 140 and cavity 104. Any structure for the function of connection the spaces in chamber 140 and cavity 104 can be taken. Likewise in FIG. 2B, for another MEMS structure, the substrate 100" does not have the cavity 104 and the through holes 130 are still formed in the substrate 100". In other words, the through holes 130 may be formed in various manners as needed.

Figure 3:
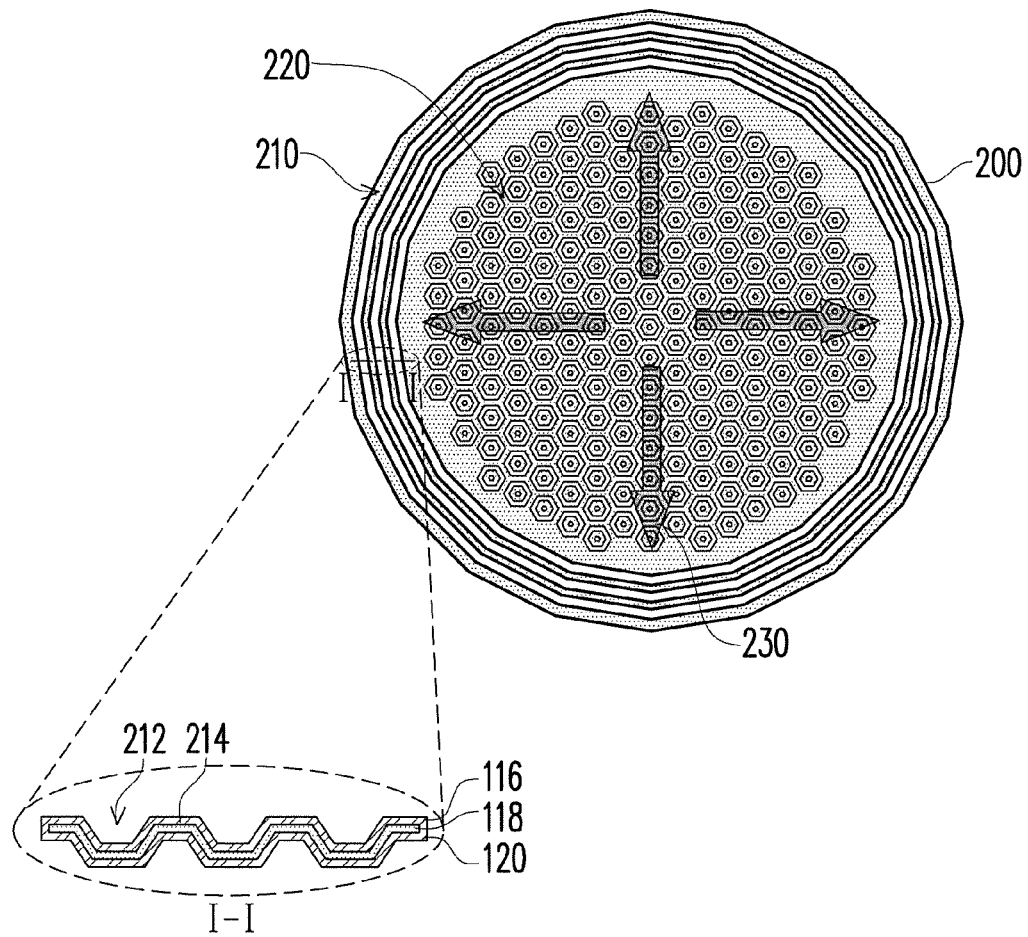
FIG. 3 is a top view and a cross-sectional view drawing, schematically illustrating a structure of a diaphragm in MEMS structure, according to an embodiment of the invention.

The structures of diaphragm in the MEMS structure are now described in more details. FIG. 3 is a top view and a cross-sectional view drawing, schematically illustrating a structure of a diaphragm in MEMS structure, according to an embodiment of the invention. In FIG. 3, the diaphragm 200 is basically divided into two regions: central region 220 and outer ring region 210. The cross-sectional view for the guard ring region 210 is shown at the lower drawing. The top view is shown at the upper drawing. The guard ring region 210 includes indent ring 212, which is indent from the diaphragm reference region 214. The indent ring 212 can also be known as the trench ring. However, as previously mention, if the diaphragm 200 is up-side down, then the indent ring 212 becomes ridge ring 212. The following embodiments take the indent manner for descriptions. However, it can be indent or ridge, termed as indent/ridge.

In this embodiment, the several indent rings like the trench rings surround the central region 220. The central region of the diaphragm 200 has multiple the indent units in a geometric shape, such as hexagonal, to form a honey-comb-like structure. In other words, the diaphragm at the central region 220 is not just a flat plane. Due to the indent structures, the residue stress of the diaphragm during fabrication can be absorbed by the indent structures. The stress as indicated by the arrows 230 in an example can be absorbed by the indent structure at the guard ring region 210 and the indent units at the central region 220.

Figure 4:
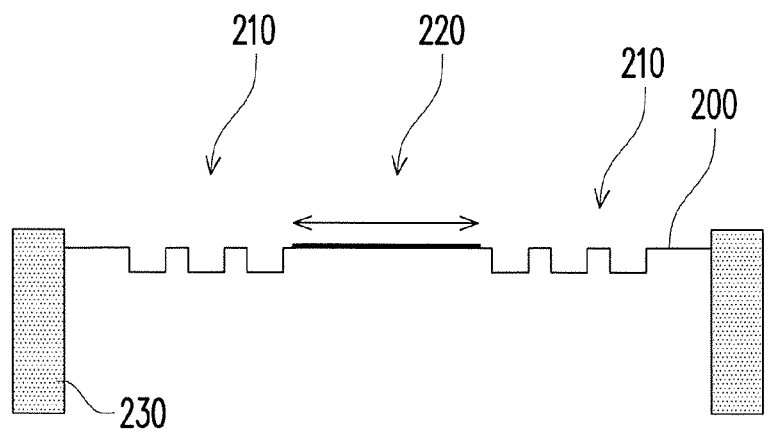
FIG. 4 is a cross-sectional view drawing, schematically illustrating a diaphragm of MEMS structure corresponding to FIG. 3.

FIG. 4 is a cross-sectional view drawing, schematically illustrating a diaphragm of MEMS structure corresponding to FIG. 3. For a brief drawing to shown the basic structure for the guard ring region 210. The structural dielectric layer 230 holds the diaphragm 200 at the periphery end. The guard ring region 210 at two sides of the central region 220 in the cross-sectional view. The central region 210 in this example is flat without showing the indent units seen in FIG. 1 and FIGS. 2A-2B.

Figure 5:
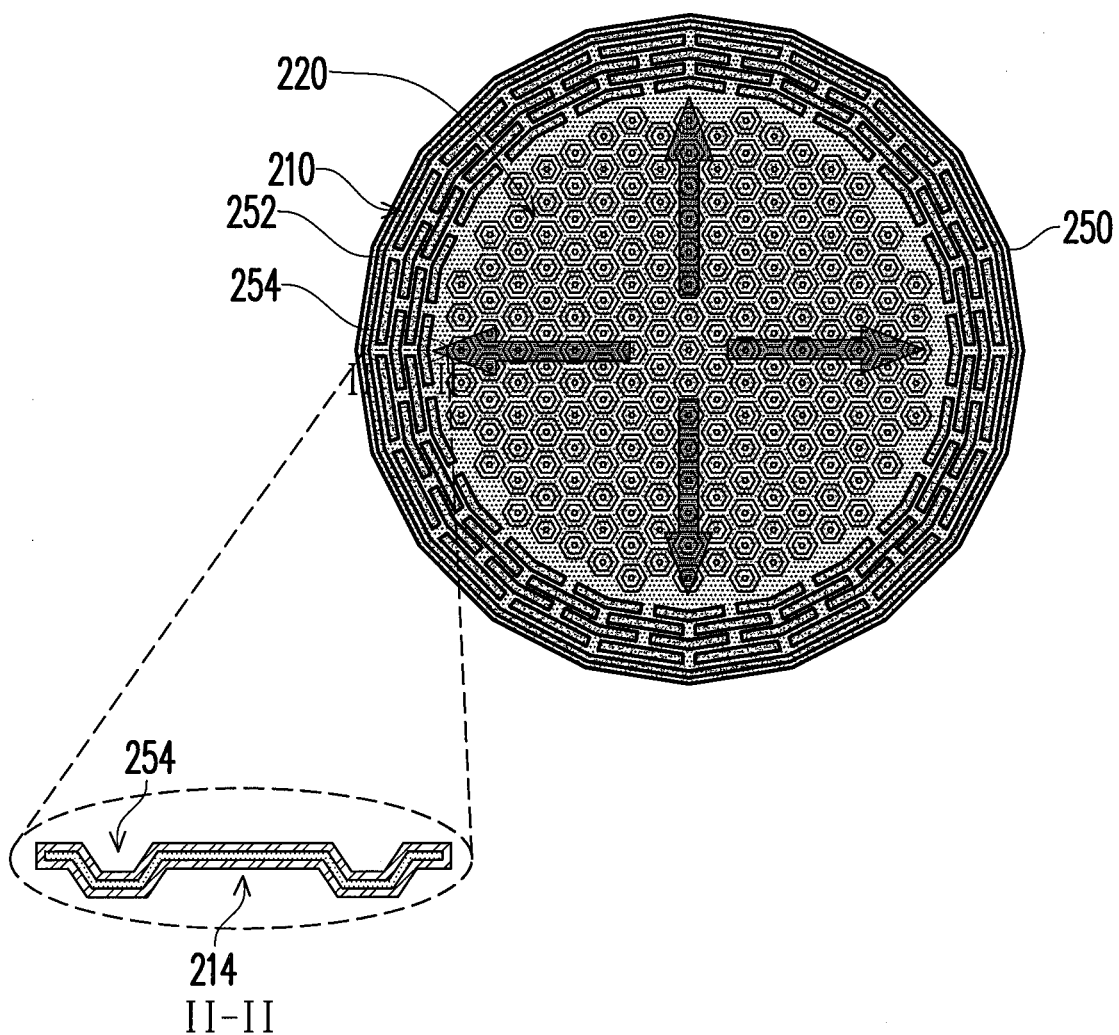
FIG. 5 is a top view and a cross-sectional view drawing, schematically illustrating a structure of a diaphragm in MEMS structure, according to an embodiment of the invention.

FIG. 5 is a top view and a cross-sectional view drawing, schematically illustrating a structure of a diaphragm in MEMS structure, according to an embodiment of the invention. In FIG. 5, the guard ring region 210 of the diaphragm 250 includes several indent rings 254, which are discontinuous. The central region 220 also has multiple indent units, arranged into honey-comb-like structure. A cross-sectional view of the indent rings 254 is shown at the lower drawing while the upper drawing is a top view. In this embodiment, the indent rings 254 are indent from the diaphragm reference region 214, for example. Each of the indent rings 254 is composed of several indent segments. There are gaps between the indent segments. It should be noted in this embodiment that the gaps of one discontinuous indent ring 254 is blocked by the indent segments of the adjacent one of the discontinuous indent rings 254. The gaps in different indent rings are not aligned but interlaced. In addition, a continuous indent ring 252 may be added with the discontinuous indent rings 254. In this example, the continuous indent ring 252, for example, is disposed to the outermost ring. Generally, the indent ring 252 can be inserted to the set of the indent rings 254 inside or innermost. However, continuous indent ring 252 is a further option, not absolutely needed. As a result, the residue stress as for example shown in arrows can be absorbed by the diaphragm 250.

Figure 6A:
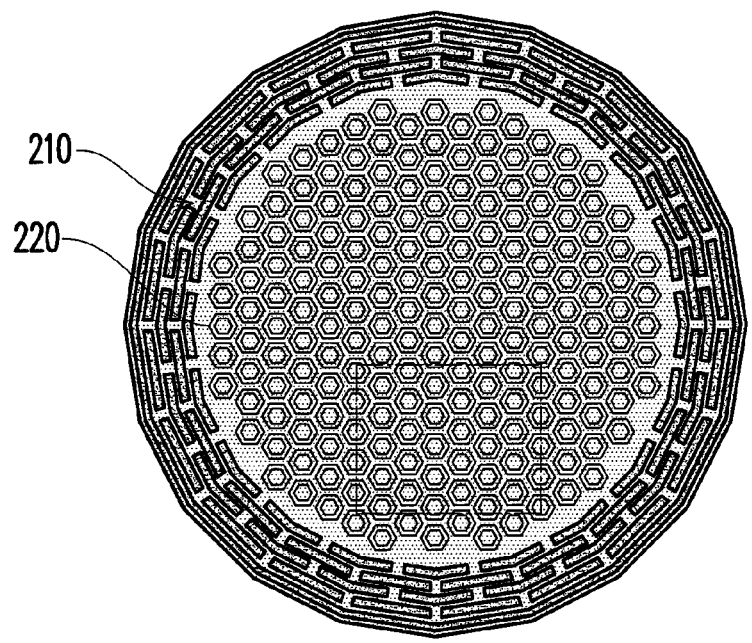
FIGS. 6(a)-6(c) are drawings, schematically illustrating a structure of the diaphragm, according to an embodiment of the invention.
Figure 6B:
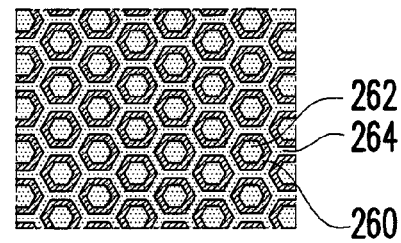
Figure 6C:
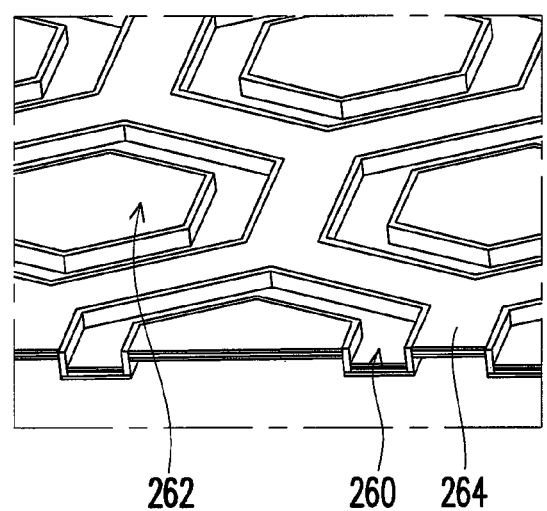

The structure of the indent units are described in detail as follows. FIGS. 6(a)-6(c) are drawings, schematically illustrating a structure of the diaphragm, according to an embodiment of the invention. In FIG. 6(a), the guard ring region 210 includes several discontinuous indent rings as described in FIG. 5. Here, the indent units at the central region 220 are further described. The structure in the indicated rectangular region is shown in FIG. 6(b) and FIG. 6(c). In geometric shape, the indent units can be any proper shape, such as polygon or round. In this example, the indent units are hexagonal shape, so as to have the better arrangement. As a result, a honey-comb-like structure can be formed. Each indent unit in this embodiment includes an enclosed indent ring 260 with the hexagonal shape to surround a center region 262. The indent units defined by the enclosed indent rings 260 are separated by the separation region 264. The separation region 264 in this example is at the diaphragm reference height level. Here as also previously mentioned, when the diaphragm is up-side-down, the trench ring 260 would become a ridge ring 260 with respect to the separation region 264. The center region 262 and the separation region 264 can be the same level at the diaphragm reference height level, and the indent ring 260 is indent with respect to the diaphragm reference level.

It can also be known in semiconductor fabrication, the indent/ridge structure for the enclosed trench ring 260 can be formed. The diaphragm in this example is formed in a stack structure, which includes multiple layers being stacked.

Figure 7A:
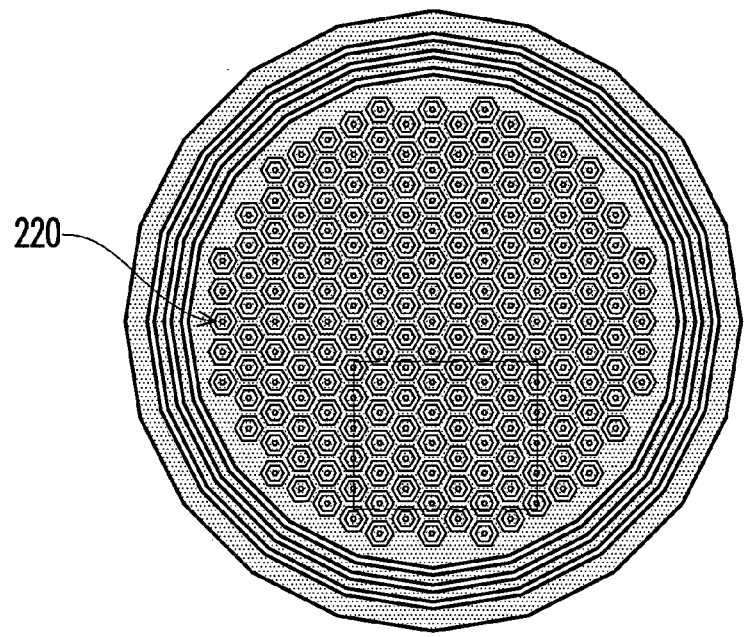
FIGS. 7(a)-7(c) are drawings, schematically illustrating a structure of the diaphragm, according to an embodiment of the invention.
Figure 7B:
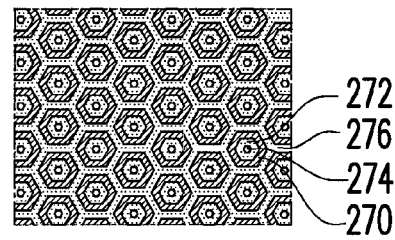
Figure 7C:
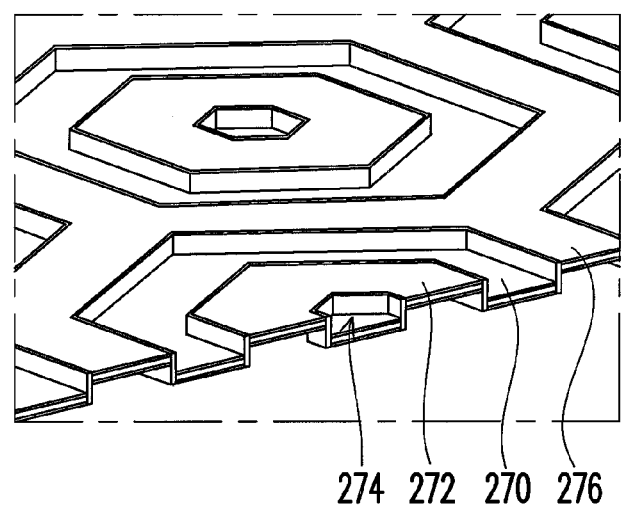

Based on the structure shown in FIGS. 6(a)-6(c), a further modification for the indent units can be done. FIGS. 7(a)-7(c)

are drawings, schematically illustrating a structure of the diaphragm, according to an embodiment of the invention. In FIG. 7(a), the indent units at the central region 220 are further modified. In FIG. 7(b) and FIG. 7(c), Each indent unit in this embodiment includes an enclosed indent ring 270 with the hexagonal shape to surround a center region 272. The indent units defined by the enclosed indent rings 270 are separated by the separation region 276. The separation region 276 in this example is at the diaphragm reference region. The center region 272 and the separation region 276 can be the same level at the diaphragm reference height level, and the indent ring 270 is indent with respect to the diaphragm reference height level. In addition, there is a further indent 274 is at the center. As a result, the corrugated portion increases and the residue stress can be released as well.

As also be noted, the diaphragm in this example, is a single layer. In other words, the diaphragm can be any proper stacked structure or a single layer without specific choice.

Figure 8A:
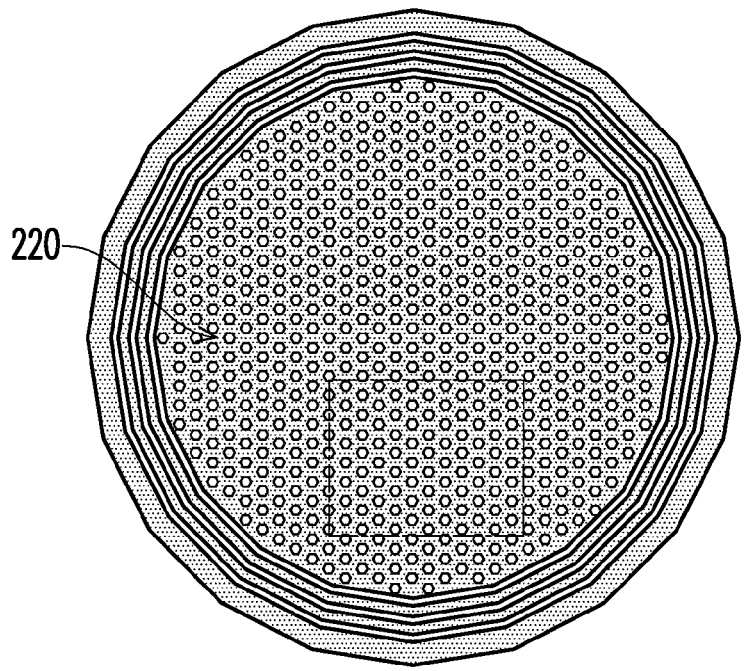
FIGS. 8(a)-8(c) are drawings, schematically illustrating a structure of the diaphragm, according to an embodiment of the invention.
Figure 8B:
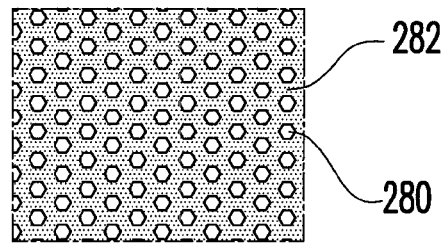
Figure 8C:
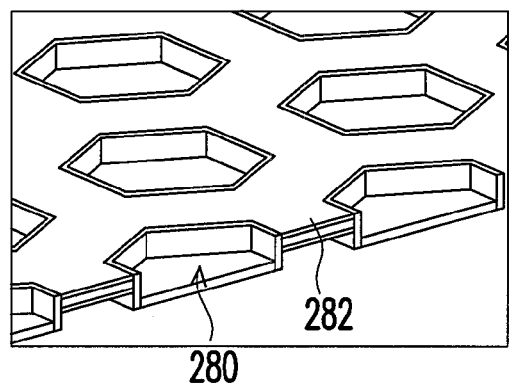

Further modifications for the indent unit can be made to be simple structure. FIGS. 8(a)-8(c) are drawings, schematically illustrating a structure of the diaphragm, according to an embodiment of the invention. In FIG. 8(a), the central region 220 of a diaphragm can be simplified as shown in FIG. 8(b) and FIG. 8(c). In this embodiment, the indent units can be just single indent regions 280, such as hexagonal indent region 280 or other geometric shape. The indent regions 280 are separated by the separation region 282, which is at the diaphragm level, for example.

As also be noted in FIG. 8(c), the diaphragm in this example is partially stacked. The separation region 282 may have the stacked structure while the indent region 280 can be single layer. More options are to be shown in FIG. 11.

Figure 9:
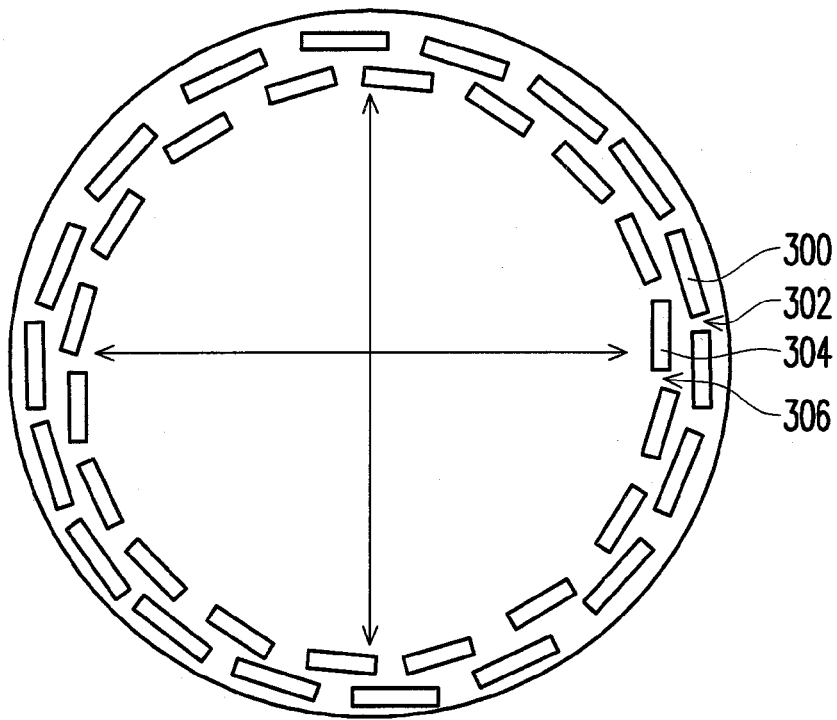
FIG. 9 is a drawing, schematically illustrating a structure of the diaphragm with indent/ridge rings, according to an embodiment of the invention.

Here referring to the discontinuous indent ring again, the locations of the gaps are further considered. FIG. 9 is a drawing, schematically illustrating a structure of the diaphragm with indent/ridge rings, according to an embodiment of the invention. In FIG. 9, the central region of the diaphragm may be just a flat plane or have the indent units in a geometrical arrangement. The central region can be any proper option. However, the guard ring region is concerned. Each of the indent rings is composed of several indent segments 300, 304. For example in this embodiment, the outer indent ring is composed of several indent segments 300. The inner indent ring is composed of several indent segments 304. There are gaps 302 between the indent segments 300 and there are gaps 306 between the indent segments 304. The gaps 302 are shifted from the gaps 306 or in other words blocked by the indent segments 304 of the adjacent indent ring.

In the example of FIG. 9, the direction of some residue stress, as shown in arrows, can be stop or released by the indent rings with shifted gaps. However, the gaps may be aligned.

Figure 10:
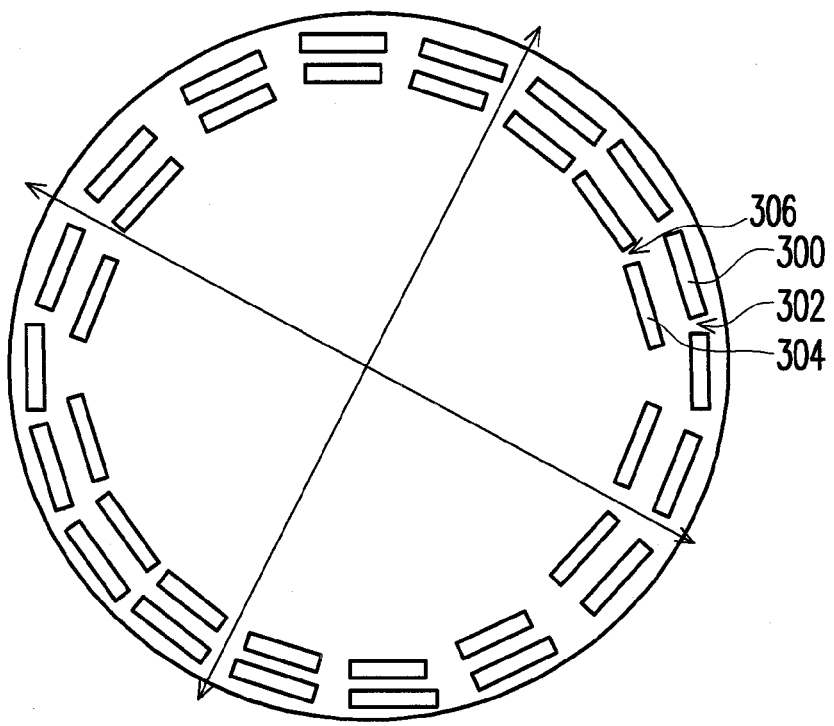
FIG. 10 is a drawing, schematically illustrating a structure of the diaphragm with indent/ridge rings, according to an embodiment of the invention.

FIG. 10 is a drawing, schematically illustrating a structure of the diaphragm with indent/ridge rings, according to an embodiment of the invention. In FIG. 10, at least a portion or all portions of the gaps 302 of the outer indent ring is aligned to the gaps 306 of the inner indent ring, for example. In this situation, some of the residue stresses, as shown by the arrows, may leak out. However, the discontinuous indent ring with the segments in FIG. 10 can still absorb the residue stress. In the structure of using indent segments to form the guard rings, each of the indent segments is independent, in which one or some segments may be damaged. Due to the structure of the segments, the stress or damage can be localized at certain segments without propagating to whole continuous ring.

Figure 11:
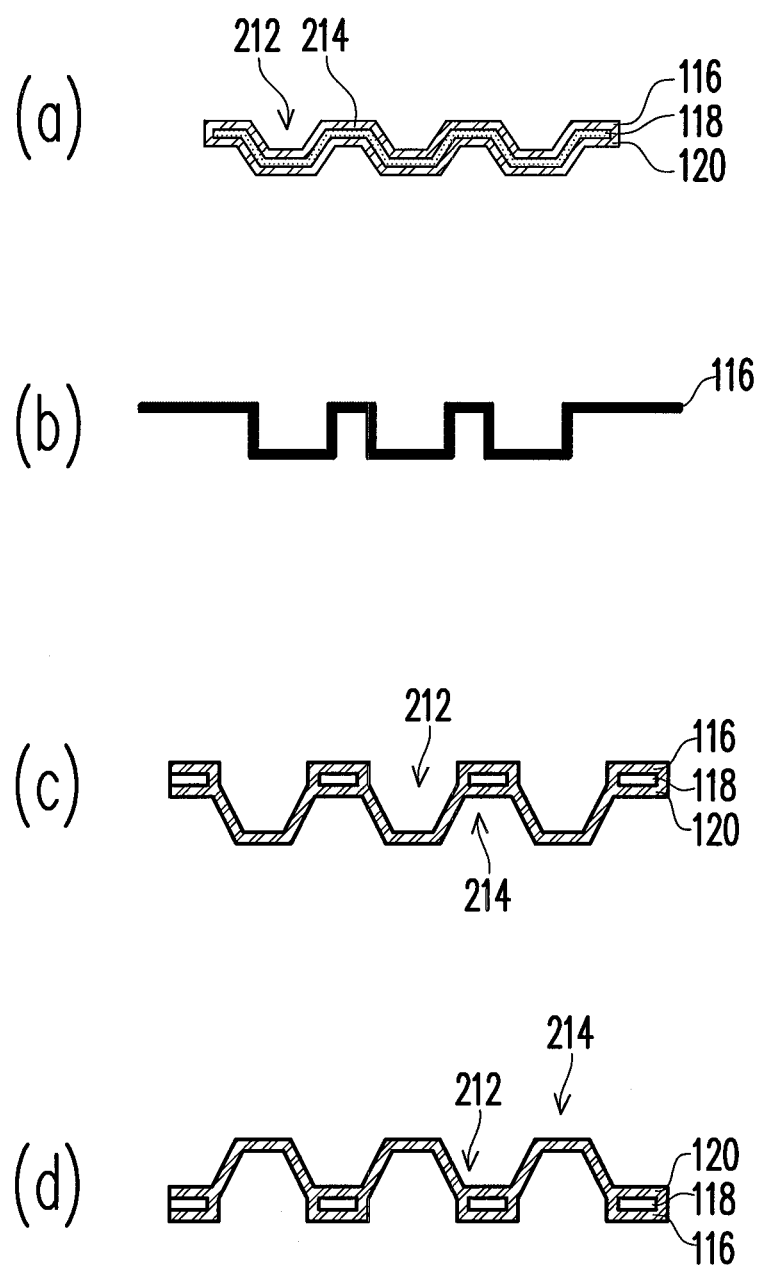
FIG. 11 is a drawing, schematically illustrating a structure of the diaphragm with indent/ridge rings, according to an embodiment of the invention.

Furthermore in considering the stack property of the diaphragm, there are several options depending on the choice in associating with the fabrication process. FIG. 11 is a drawing, schematically illustrating a structure of the diaphragm with indent/ridge rings, according to an embodiment of the invention. In FIG. 11(a), the diaphragm is formed by multiple layers in stack. In this example as also previously shown, three layers are used to form the diaphragm, including two conductive layers 116, 120 and one dielectric layer 118 sandwiched between the two conductive layers 116, 120. Here, the corrugated structure of the diaphragm is schematically shown. The corrugated structure in cross-sectional view is depending on what the structures are taken at the guard ring region and the central region. In FIG. 11(b), the diaphragm can also be formed by a single conductive layer 116 in another example. In FIG. 11(c), the diaphragm may just have a portion being stack. In this example, the main portion of the diaphragm at the diaphragm reference region 214 is formed by stack structure while the indent part 212 is a single conductive layer. The dielectric layer is enclosed by the outer conductive layer. This kind of stack structure is also referred to mixed layer. Likewise, when the diaphragm in FIG. 11(c) is up-side-down as shown in FIG. 11(d). The indent part 212 becomes the ridge part. The indent part with respect to the ridge part is a stack structure. For both the situations, the term of "indent/ridge" is used to show the possibility. However, the diaphragm in stack structure is not just limited to the embodiments in FIG. 11.

The invention has proposed the diaphragm, which include the design at the guard ring region and the central region. The guard ring region preferably is formed by discontinuous rings. However, a mixed of discontinuous ring and continuous ring can be taken, or all continuous rings are taken. For the central region, the indent units are arranged in a geometric compact manner, such as the honey-comb-like structure. The indent unit can also be a simple indent region or mixed with indent ring and center indent. As a result, the residue stress can be absorbed by the corrugated structures.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A micro-electromechanical systems (MEMS) structure, comprising:
   a substrate, having a front side and a back side, wherein the substrate have a predeteimined region;
   a structural dielectric layer, disposed over the front side of the substrate;
   a diaphragm, held by the structural dielectric layer at a peripheral end, wherein the diaphragm is above the substrate corresponding to the predeteimined region and forms a chamber between the substrate and the diaphragm, the chamber is connected to an outer space by multiple through holes in the substrate or in a structure layer on the front side of the substrate, or in both the substrate and the structure layer,
   wherein the diaphragm comprises:
      a plurality of trench/ridge rings at a peripheral region surrounding a central region of the diaphragm; and
      a corrugated structure, located at the central region of the diaphragm, surrounded by the trench/ridge rings.

2. The MEMS structure of claim 1, wherein the trench/ridge rings are discontinuous, each of the trench/ridge rings being discontinuous is formed by a plurality of trench/ridge segments.

3. The MEMS structure of claim 2, wherein multiple gaps between the trench/ridge segments in each of the trench/ridge rings are blocked by the trench/ridge segments of at least another one of the discontinuous trenches in a radiant direction from a center.

4. The MEMS structure of claim 3, wherein the corrugated structure of the diaphragm comprises a plurality of indent/protruding units, arranged in a honey-comb-like geometric structure.

5. The MEMS structure of claim 4, wherein each of the indent/protruding units comprises an enclosed ring of trench/ridge to surround an inner region.

6. The MEMS structure of claim 5, wherein the enclosed ring of trench/ridge in geometric shape is polygon, circular or hexagonal.

7. The MEMS structure of claim 4, wherein each of the indent/protruding units comprises an enclosed ring of trench/ridge to surround an inner region and a center trench/ridge within the inner region.

8. The MEMS structure of claim 7, wherein the enclosed ring of trench/ridge in geometric shape is polygon, circular or hexagonal.

9. The MEMS structure of claim 2, wherein multiple gaps between the trench/ridge segments in each of the trench/ridge rings are aligned to form a radiant gap line.

10. The MEMS structure of claim 9, wherein the corrugated structure of the diaphragm comprises a plurality of indent/protruding units, arranged in a honey-comb-like geometric structure.

11. The MEMS structure of claim 10, wherein each of the indent/protruding units comprises an enclosed trench/ridge to surround an inner region.

12. The MEMS structure of claim 11, wherein the enclosed trench/ridge in geometric shape is polygon, circular or hexagonal.

13. The MEMS structure of claim 10, wherein each of the indent/protruding units comprises an enclosed trench/ridge to surround an inner region and a center trench/ridge in the inner region.

14. The MEMS structure of claim 13, wherein the enclosed trench/ridge in geometric shape is polygon, circular or hexagonal.

15. The MEMS structure of claim 1, wherein the trench/ridge rings include at least one being discontinuous and formed by a plurality of trench/ridge segments and at least one continuous ring.

16. The MEMS structure of claim 1, wherein the diaphragm is a single layer formed by a single material.

17. The MEMS structure of claim 1, wherein the diaphragm is a stacked layer.

18. The MEMS structure of claim 1, wherein the diaphragm has a stacked portion just at the trench/ridge rings.

19. The MEMS structure of claim 1, wherein the corrugated structure of the diaphragm comprises a plurality of indent/protruding units, arranged in a honey-comb-like geometric structure.

20. A micro-electromechanical systems (MEMS) structure, comprising:
   a substrate, having a front side and a back side, wherein the substrate have a predetermined region;
   a structural dielectric layer, disposed over the front side of the substrate;
   a diaphragm, held by the structural dielectric layer at a peripheral end, wherein the diaphragm is above the substrate corresponding to the predetermined region and forms a chamber between the substrate and the diaphragm, the chamber is connected to an outer space by multiple through venting holes in the substrate or in a structure layer on the front side of the substrate, or in both the substrate and the structure layer,
   wherein the diaphragm comprises a plurality of trench/ridge rings at a peripheral region surrounding a central region of the diaphragm, and each of the trench/ridge rings is discontinuous and formed by a plurality of trench/ridge segments.

* * * * *